United States Patent [19]
Miller et al.

[11] Patent Number: 5,712,883
[45] Date of Patent: Jan. 27, 1998

[54] CLOCK SIGNAL DISTRIBUTION SYSTEM

[75] Inventors: Charles A. Miller, Fremont, Calif.; Daniel J. Bedell, Portland, Oreg.

[73] Assignee: Credence Systems Corporation, Fremont, Calif.

[21] Appl. No.: 581,000

[22] Filed: Jan. 3, 1996

[51] Int. Cl.$^6$ .................................................. H04L 7/00
[52] U.S. Cl. ........................ 375/371; 375/373; 375/356; 327/153; 371/1
[58] Field of Search ............................ 375/354, 356, 375/373, 371, 376; 327/292, 141, 144, 153, 261; 371/1

[56] References Cited

U.S. PATENT DOCUMENTS

| | | | |
|---|---|---|---|
| 3,496,477 | 2/1970 | Page | 328/120 |
| 4,447,870 | 5/1984 | Tague et al. | 364/200 |
| 5,258,660 | 11/1993 | Nelson et al. | 327/261 |
| 5,293,626 | 3/1994 | Priest et al. | 395/550 |
| 5,298,866 | 3/1994 | Kaplinsky | 327/261 |
| 5,305,451 | 4/1994 | Chao et al. | 395/550 |
| 5,307,381 | 4/1994 | Ahuja | 375/356 |
| 5,317,601 | 5/1994 | Riordan et al. | 375/356 |
| 5,361,277 | 11/1994 | Grover | 375/356 |
| 5,369,640 | 11/1994 | Watson et al. | 371/1 |
| 5,481,573 | 1/1996 | Jacobowitz et al. | 375/356 |
| 5,570,053 | 10/1996 | Takla | 327/292 |
| 5,570,054 | 10/1996 | Takla | 327/292 |

*Primary Examiner*—T. Ghebretinsae
*Attorney, Agent, or Firm*—Smith-Hill and Bedell

[57] ABSTRACT

A system for distributing synchronous clock signals includes a set of spatially distributed deskewing stages. Each stage includes matching adjustable first and second delay circuits and a phase lock loop controller. Matching pairs of transmission lines interconnect successive stages of the set. One transmission line of each pair connects the output of the first delay circuit of each stage to the input of the first delay circuit of a next stage of the set. The other transmission line of the pair connects the input of the second delay circuit of the stage to the input of the first delay circuit of the next stage. When the first delay circuit of the first stage of the set receives an input reference clock signal, that reference clock signal propagates through all the first delay circuits of each stage in succession. Whenever the input reference clock signal reaches a stage, it also travels back to the second delay circuit of the preceding stage. The phase lock loop controller in each stage adjusts the similar delay provided by its first and second delay circuits to phase lock the output second delay circuit to the input of the first delay circuit. Each stage also includes a frequency multiplier for doubling the frequency of its first input signal thereby to produce one of the spatially distributed local clock signals.

27 Claims, 9 Drawing Sheets

CLOCK SIGNAL DISTRIBUTION SYSTEM

BACKGROUND OF THE INVENTION

1. Field of the Invention

The present invention relates to a system for providing clock signals of similar phase and frequency to spatially distributed modules of an electronic circuit.

2. Description of Related Art

In a digital system formed by a set of interconnected operating modules, one of the signals distributed to each module is a clock signal for controlling the timing of data transfer operations between the modules. For example a computer may include several circuit boards or distributed processors mounted in a chassis and interconnected by backplane wiring to a module containing a central controller and a clock signal source. One of the conductors in the backplane carries the clock signal to each of the other modules in the system. For proper operation of the circuit, clock signal pulses should arrive at the various modules at substantially the same time; otherwise reliable data transmission is not ensured. However, since the modules are at varying distances along the backplane from the clock signal source, the clock signal pulses do not arrive at each circuit board concurrently. Such clock signal skew is tolerable at lower clock signal frequencies where it is small compared to the period of the clock signal. But at higher clock frequencies where clock signal skew becomes a significant portion of the clock signal period, data transmission on the backplane becomes unreliable.

Signal skew can also be a problem in electronic instruments having distributed components that must operate together in a synchronous manner. For example, an integrated circuit (IC) tester may include a host unit and multiple operating modules spatially distributed but interconnected for communicating with the host unit. Each operating module may provide an interface to a separate pin of an IC under test. At various times, an operating module may transmit a test signal to an IC pin or may acquire output data produced by the IC at the pin. One of the functions of the host unit is to coordinate the actions of the operating modules. For example, to signal the start of a test the host unit may transmit a "start" signal to each operating module. The host unit may also transmit a global clock signal to each operating module to synchronize the actions of the operating modules during the test and to synchronize data transmission between the host and the modules during the test. If the clock and other control and data signals travel varying distances to reach the operating modules, they arrive at the various modules at different times. Such control and clock signal skew, if sufficiently large, can result in a timing mismatch between module operations and can adversely affect synchronous communications between the modules and the host unit.

U.S. Pat. No. 5,369,640 issued Nov. 29, 1994 to Watson et al. describes a system for reducing skew in a clock signal sent to remote operating modules by providing a separate transmission line from the clock signal source to each operating module and by adjusting the transmission lines so that they all have the same length. However this "star bus" solution to the signal skew problem can be somewhat unwieldy in systems having a large number of operating modules because so many transmission lines must emanate from the signal source.

Another method for eliminating clock signal skew is described in U.S. Pat. No. 4,447,870 issued May 8, 1984 to Tague et al. Here an adjustable delay circuit is provided on each operating module for further delaying the clock signal after it arrives at each operating module. The delay circuit in each operating module is adjusted so that the sum of delays provided by the clock signal transmission line and the adjustable delay circuit is equal to a standard delay. This method allows the clock signal to be delivered to the operating modules through a single transmission line connected to all operating modules as in a backplane. However it requires a time-consuming and difficult process of manually calibrating the delay circuit in each operating module. Also, whenever an operating module is moved to a new position along the transmission line its clock delay circuit must be readjusted.

U.S. Pat. No. 5,361,277 issued Nov. 1, 1994 to Grover describes a system for delivering a phase synchronized clock signal to each of several distributed circuit modules. The system employs parallel "outgoing" and "return" transmission lines routed to each module. A clock source transmits an outgoing clock signal on the outgoing transmission line to each module in turn and then to a distant point beyond the last module where the outgoing and return transmission lines are tied together. The clock signal then returns from the distant point passing each module in reverse order via the return transmission line. A deskewing circuit at each module taps the transmission lines as they pass the module. The deskewing circuit monitors the phases of outgoing and returning clock signals and produces a local clock signal having a phase that is midway between the phases of the outgoing and returning clock signals. The local clock signals produced by all deskewing circuits are all in phase regardless of the variation in distance of the modules from the clock source. Grover describes relatively complicated circuits for producing a local clock signal having a phase midway between the outgoing and returning clock signals. These circuits rely on counters, oscillators, ramp generators and/or frequency dividing circuits that are difficult to implement, that are subject to jitter, that do not lend themselves to digital I.C. techniques, or that require substantial integrated circuit space when incorporated into IC's implementing the modules. Also the interval halving and phase lock techniques taught by Grover do not correct for local clock circuit layout path variations that contribute to phase error. In addition, when used for large distributed processor systems and complex integrated circuit designs, clock fan-out and distribution becomes a significant problem. In such systems the clock signal may have to be distributed to hundreds or thousands of modules. A single clock source capable of driving so many circuit modules is difficult to realize.

What is needed is a system for delivering synchronized clock and data signals to spatially distributed modules of a synchronous digital circuit module. The system should lend itself to digital integrated circuit fabrication techniques and should not require complicated circuitry at each module or circuit cluster. The system should also be relatively insensitive to noise or temperature variation and should minimize reference clock signal fan-out.

SUMMARY OF THE INVENTION

A system for providing synchronized local clock signals to spatially distributed modules of a logic system includes a series of deskewing stages, each stage being located proximate to a corresponding one of the modules. Each stage includes matching adjustable first and second delay circuits and a phase lock loop controller. Pairs of matching transmission lines interconnect successive stages of the series such that pulses of an input periodic reference signal propagate through all the first delay circuits of the stages in succession and such that whenever a pulse of the reference signal reaches the input of a first delay circuit of a stage via the first transmission line of a pair, it also travels back to the second delay circuit of the preceding stage via the second line of the pair. The phase lock loop controller in each stage adjusts the delays provided by the stage's first and second delay circuits to phase lock the second delay circuit output to the first delay circuit input. This ensures that the reference signal as viewed at the input of each successive stage is phase locked to the reference signal as viewed at the input to the first stage. Each stage then produces an output local clock signal which tracks the phase and frequency of its input reference signal. Thus the local clock signals supplied to all modules are synchronized with one another.

In accordance with an alternative embodiment of the invention, the signal deskewing system is expanded to form an N×M array of stages. The stages of a first column of the array are interconnected to one another so as to produce a set of N synchronized local clock signals. The local clock signal produced by each stage of the first column is then supplied as a reference signal input to the remaining M−1 stages of its same row which respond by producing additional synchronized local clock signals. The alternative embodiment of the invention minimizes accumulated phase jitter when clock signals must be supplied to a large number of circuit modules.

It is accordingly an object of the invention to provide a set synchronized local clock signals to spatially distributed circuit modules.

The concluding portion of this specification particularly points out and distinctly claims the subject matter of the present invention. However those skilled in the art will best understand both the organization and method of operation of the invention, together with further advantages and objects thereof, by reading the remaining portions of the specification in view of the accompanying drawing(s) wherein like reference characters refer to like elements.

BRIEF DESCRIPTION OF THE DRAWING(S)

DESCRIPTION OF THE PREFERRED EMBODIMENT(S)

Figure 1:
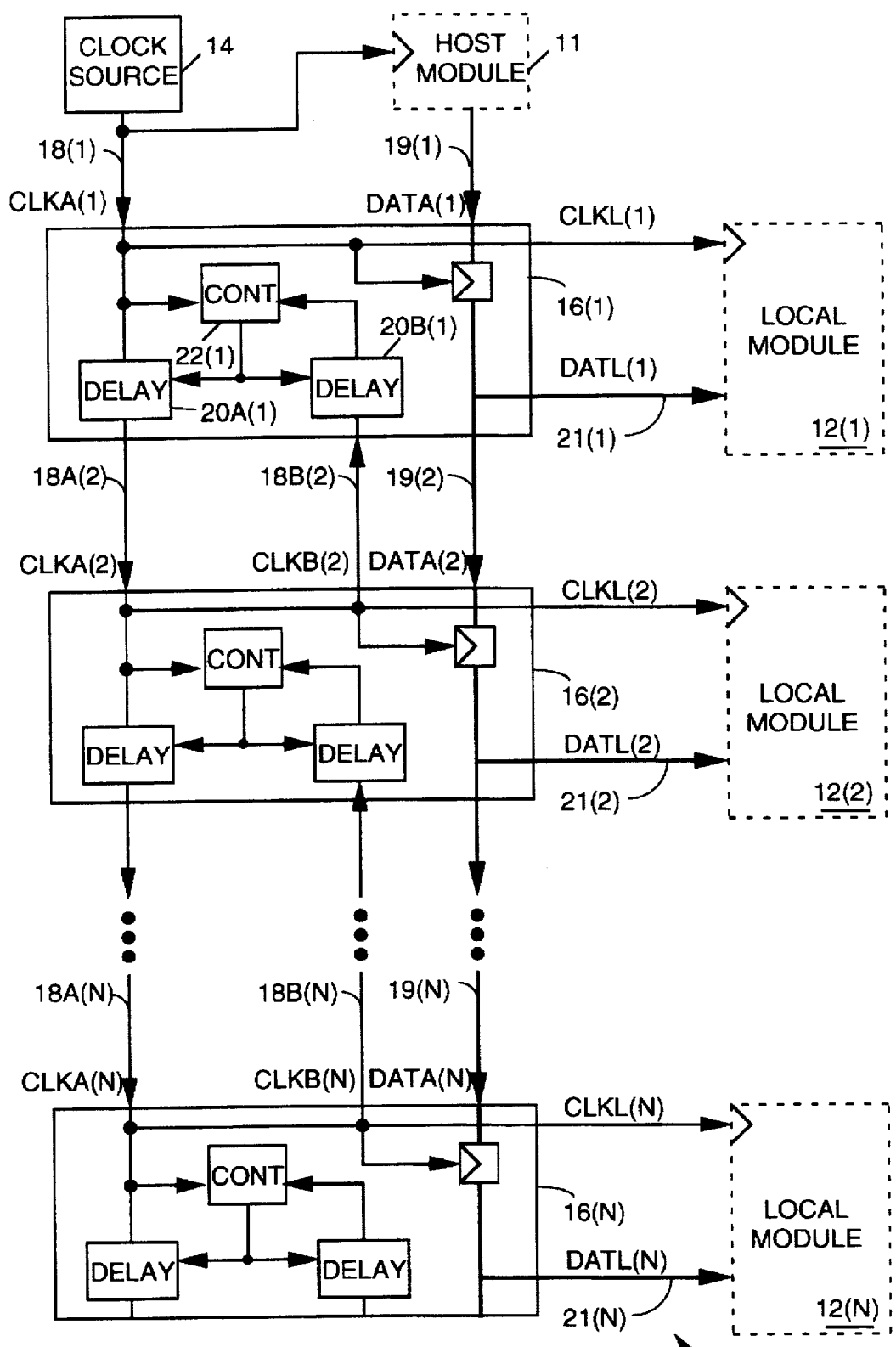
FIG. 1 is a block diagram depicting a clock signal distribution system in accordance with the present invention.

FIG. 1 depicts a clock signal distribution system 10 for producing a set of N synchronized local clock signals CLKL(1)–CLKL(N). These local clock signals can be used as clock inputs to a spatially distributed set of local modules 12(1)–12(N) of a digital electronic system. The clock signal distribution system 10 also distributes data and/or control signals from a host module 11 to each local module 12(1)–12(N).

Distribution system 10 includes a clock signal source 14 and a set of N deskewing stages 16(1)–16(N). For any number K from 1 to N, the "Kth" deskewing stage 16(K) is located near the Kth local module 12(K) and produces the Kth local clock signal CLKL(K). All local clock signals CLKL(1)–CLKL(N) are phase locked to a periodic reference signal CLKA(1) produced by clock source 14. Thus the local clock signals CLKL(1)–CLKL(N) provide clock pulses concurrently to the spatially distributed local modules 12(1)–12(N).

Figure 2:
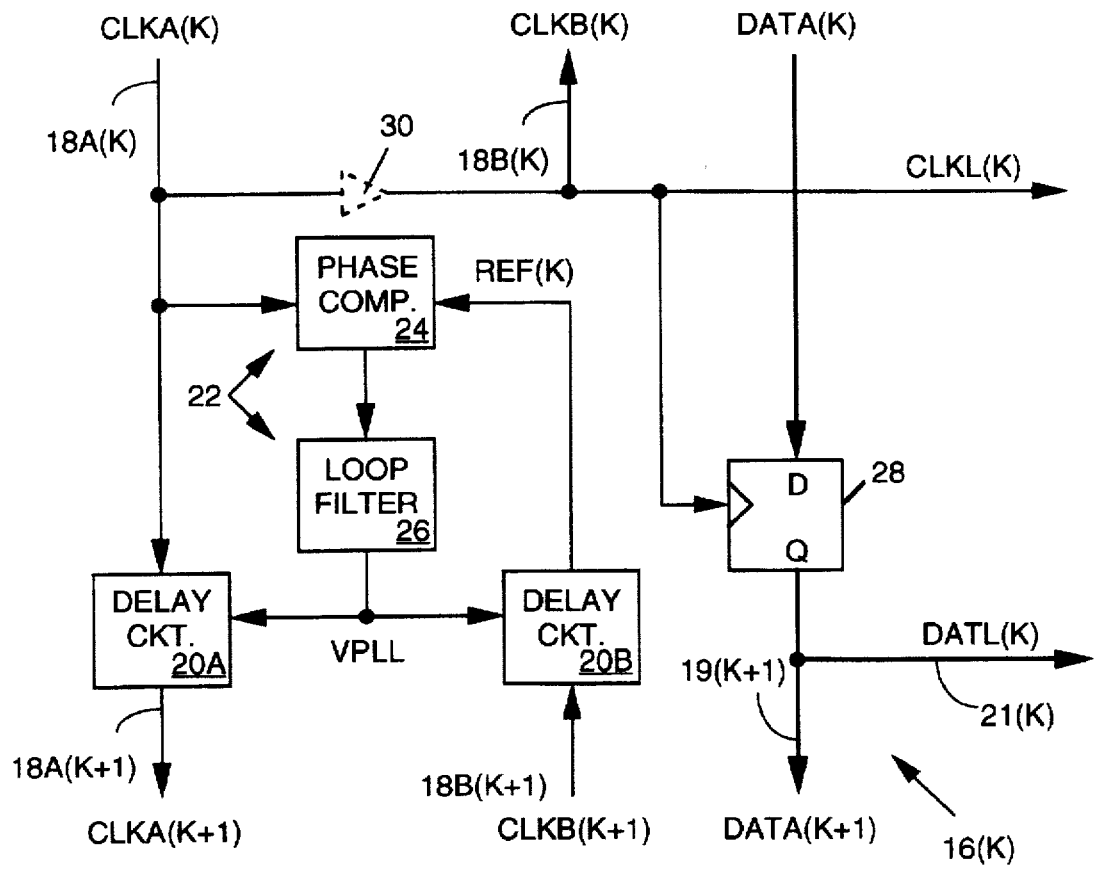
FIG. 2 is a block diagram depicting a first alternative embodiment of a typical deskewing circuit of FIG. 1.

FIG. 2 illustrates the Kth deskewing stage in more detailed block diagram form. Refering to FIGS. 1 and 2, the first deskewing stage 16(1) receives the reference clock signal CLKA(1) from clock source 14 via transmission line 18(1) and forwards it to local module 12(1) as local clock signal CLKL(1). Stage 16(1) also delays the clock signal CLKA(1) through a programmable delay cirucit 20A(1) and then passes it on to the next deskewing stage 16(2) as clock signal CLKA(2). A control circuit 22(1) within stage 16(1) automatically adjusts the delay of delay cirucit 20A(1) so that the CLKA(2) signal, as it arrives at stage 16(2) is in phase with the CLKA(1) signal arriving at stage 16(1). Stage 16(2) forwards the incoming CLKA(1) signal via transmission line 18A(2) to local module 12(2) as local clock signal CLKL(2). Note that since CLKA(2) is in phase with CLKA (1) then local clock CLKL(2) will be in phase with local clock CLKL(1). Thus pulses of local clock signals CLKL(1) and CLKL(2) will clock their respective local modules 12(1) and 12(2) concurrently.

The CLKB(2) signal is delayed by delay circuit 20B with stage 16(1) to produce a reference signal REF. A control circuit 22 in stage 16(1) adjusts delays 20A and 20B (which are identical) to phase lock REF to CLKA(1) such that CLKA(2) lags CLKA(1) by precisely one cycle.

Each successive stage 16(K) after stage 16(1) acts in a similar manner receiving an input clock signal CLKA(K) from a preceding stage 16(K−1) and delaying the incoming CLKA(K) signal to produce an output clock signal CLKA (K+1), delivered one clock cycle later to next succeeding stage 16(K+1) via transmission line 18A(K+1). Thus all clock signals CLKA(1)–CLK(N) when viewed at the inputs of stages 16(1)–16(N) are in phase with one another. All stages 16(K) also produce output local clock signals CLKL (K) in response to input reference clock signals CLKA(K). Since all reference clock signals CLKA(K) are in phase with one another, so too are all local clock signals CLKL(K). Thus all local modules 12(1)–12(N) are clocked synchronously.

Referring again to FIG. 1, distribution system 10 also conveys data or control signals (DATA) from host module 11 to local modules 12(1)–12(N) of the distributed electronic circuit. Host module 11 is suitably located very near clock source 14 so that it receives the CLKA(1) signal with little delay. A data bus 19(1), which may include one or more parallel data lines, delivers a parallel data word DATA(1) from module 11 to stage 16(1). Each line of bus 19(1) is of the same length as transmission line 18(1) and has a similar velocity of signal propagation. Stage 16(1) latches incoming input DATA(1) signals onto an output bus 19(2) as data word DATA(2) in response to a pulse from CLKA(1). Bus 19(2)

conveys DATA(2) to stage 16(2). Each subsequent stage 16(K) (for K>2) operates in a similar manner latching input data DATA(K) onto output data bus 19(K+1) in response to each pulse of input clock signal CLKA(K). Also in response to a CLKA(K) pulse, each stage 16(K) latches its input DATA(K) signals onto an output bus 21(K) as output data signals DATL(K) for delivery to the corresponding local module 12(K). Thus, for example, when the host module 11 sends a data pulse to stage 16(1) in response to the leading edge of a CLKA(1) pulse, stage 16(1) latches the data pulse onto line 21(1) to module 12(1) in response to the DATL(1) pulse. Successive stages 16(2)–16(N) latch the data pulse onto their output lines 21(2)–21(N) on successive cycles of the CLKA(1) signal.

If each local module 12(K) is programmed to wait N-K clock cycles to take an action in response to a data pulse, then all modules 12(K) will respond concurrently to the data pulse. For example local modules 12(1)–12(N) could be part of an integrated circuit tester and each module 12(K) could be programmed to start its portions of test operations N-K clock pulses following receipt of a data signal pulse. Thus all local modules would start the test at the same time, N cycles after the host module 11 transmitted a data pulse on line 19(1).

FIG. 2 illustrates a first embodiment of a typical deskewing stage 16(K) of FIG. 1 in block diagram form. Stage 16(K) includes a matched pair of variable delay circuits 20A and 20B and a phase lock loop controller 22 consisting of a phase comparator 24 and a loop filter 26. The incoming reference clock signal CLKA(K) on line 18A(K) is routed back to the preceding stage 16(K–1) as return clock signal CLKB(K) via transmission line 18B(K). Thus the arriving CLKA(K) signal and the departing CLKB(K) signal are of substantially the same phase and frequency. The CLKA(K) signal is also supplied to an input of phase comparator 24. The CLKA(K) signal is also routed outward to local module 12(K) of FIG. 1 as the local clock signal CLKL(N).

An amplifier 30 may be inserted between lines 18A(K) and 18B(K) when lines 18A(K) and 18B(K) significantly attenuate the clock signals. The phase and frequency of CLKB(K) will still track that of CLKA(K) but with a slight delay. However this delay will not affect accuracy of local clock synchronization.

Delay circuit 20A delays input clock signal CLKA(K) to produce output clock signal CLKA(K+1) supplied to the next stage 16(K+1) via transmission line 18A(K+1). Delay circuit 20B delays the return signal CLKB(K+1) from succeeding stage 16(K+1) to produce a reference clock signal REF(K) supplied to a second input of phase comparator 24. Phase comparator 24 increases its output signal when REF(K) lags CLKA(K) and decreases its output signal when REF(K) leads CLKA(K). Loop filter 26 filters (integrates) the phase comparator 24 output signal to produce a control signal VPLL supplied to control inputs of variable delay circuits 20A and 20B. The delay of each circuit 20A or 20B varies inversely with the voltage of input control signal VPLL.

A pulse of the CLKA(K) signal arriving at stage 16(K) appears at a first input of phase comparator 24. The pulse then travels though delay circuit 20A to next stage 16(K+1) and returns to stage 16(K) as a pulse of the CLKB(K) signal to stage 16(K) via line 18(K+1). The returning pulse passes through delay circuit 20B of stage 16(K) and finally arrives as a pulse of REF(K) at the second input of phase comparator 24. Phase comparator 24 and loop filter 26 operate together to control the (similar) delays of delay circuits 20A and 20B so that REF(K) is phase locked to CLKA(K).

The two transmission lines 18A(K+1) and 18B(K+1) conveying the clock pulse on its round trip between stages 16(K) and 16(K+1) are matched both in length and velocity of signal propagation so that they provide the same inherent signal delay between stages 16(K) and 16(K+1). Also, since delay circuits 20A and 20B are similar and are controlled by the same signal VPLL, they too have similar delays. Thus each pulse of CLKA(K) requires the same amount of time to travel from the first input of phase comparator 24 in stage 16(K) to the input of stage 16(K+1) as it requires to return from stage 16(K+1) to the second input of comparator 24 of stage 16(K). Therefore by phase locking REF(K) to CLKA (K), comparator 24 ensures that the CLKA(K+1) signal at the input to stage 16(K+1) will be either in phase with CLKA(K) at the input of stage 16(K) or 180 degrees out of phase with CLKA(K).

Since all clock signals CLKA(1)–CLKA(N) should be in phase with one another, and not 180 degrees apart, the range over which delay circuits 20A and 20B operate and the variation in transmission line distance between modules range should be limited so that the total delay between clock inputs to successive stages 16(K) and 16(K+1) is always equal to the period T the CLKA signal, and not T/2, at phase lock. For example, if the inherent delay "D18" of each transmission line 18A/18B is allowed to vary from 0.1T to 0.3T, then the delay "D20" provided by delay circuits 20A/20B should be limited to a range of, for example 0.65T to 0.95T. Thus the total delay D18+T20 will range between 0.75T and 1.15T at system startup and will stabilize at D18+D20=T with CLKA(K) and CLKA(K+1) in phase. The system cannot "false lock" at D18+D20=0.5T, with CLKA (K) and CLKA(K+1) 180 degrees out of phase, because such combination of D18 and D20 values is not obtainable.

It should also be understood that the system will operate satisfactorily when the total delay D18+D20 at phase lock is any whole multiple of T. Thus in a case where the transmission line delay D18 ranges from 2.4T to 2.6T, we may choose the variable delay range of, for example 0.40T to 0.6T. This provides a total delay that can range from 2.8T to 3.2T at system start and will phase lock at 3.0T. However, we must in any case restrict the range of transmission line delay D18 to a span of less than 0.5T.

Figure 3:
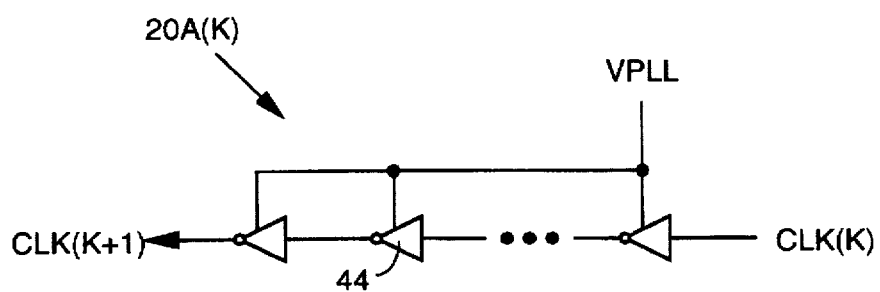
FIG. 3 is a schematic diagram depicting a typical delay circuit of FIG. 2 in more detailed block diagram form.

FIG. 3 illustrates delay circuit 20A of FIG. 2. Circuit 20B is similar. Delay circuit 20A consists of a set of similar inverters 44 connected in series having VPLL as a common power supply. The CLKA(K) signal is supplied as input to the first inverter of the series and CLKA(K+1) emerges at the output of the last inverter of the series after a delay determined by the magnitude of VPLL. The number of inverters 44 in the series, the switching speed range of each inverter 44, and the range of values of VPLL produced by controller 22 of FIG. 2 together determine the range of the delay circuit.

Referring to FIG. 2, stage 16(K) includes a set of type D flip-flops 28, each receiving at its input terminal D a separate one of DATA(K) signals arriving on input data lines 19(K) and producing a corresponding set of DATA(K+1) and DATL(K) signals at its output terminal Q when its clock terminal is pulsed by the local clock signal CLKL(K).

Figure 4:
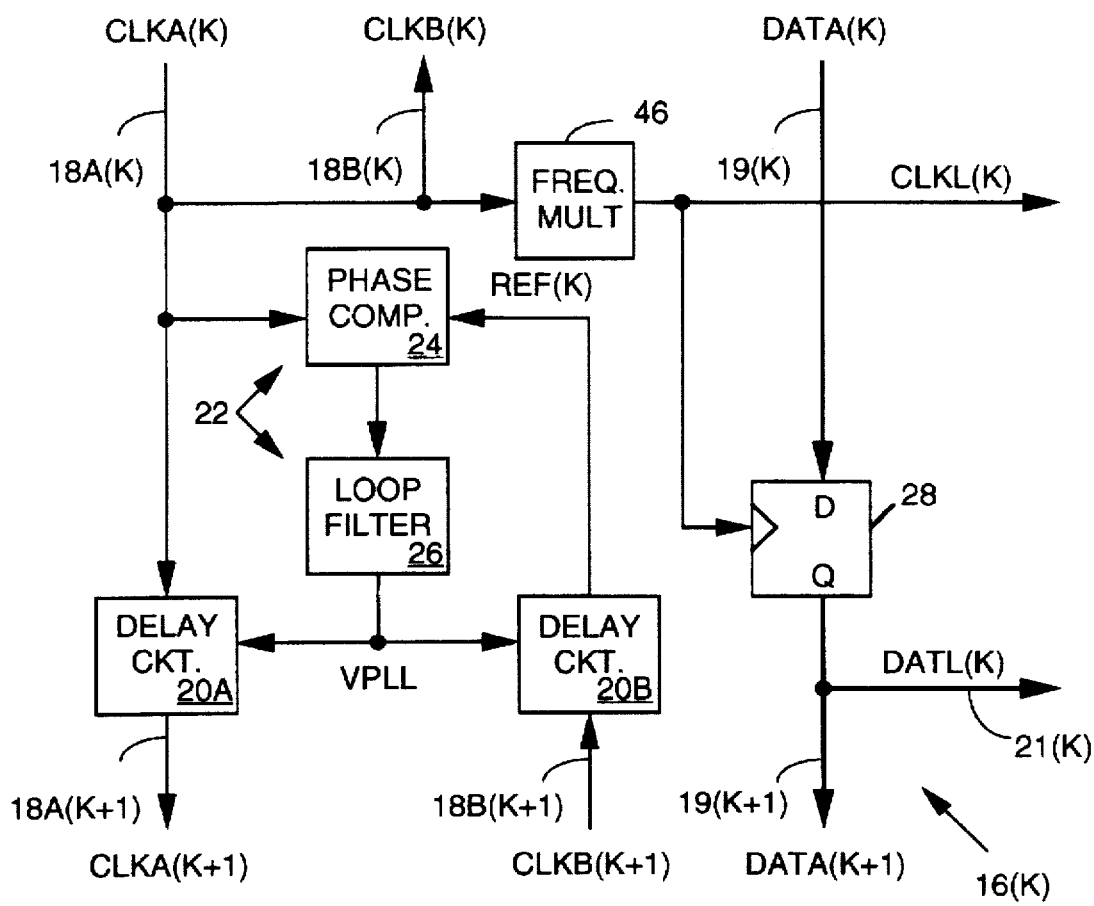
FIG. 4 is a block diagram depicting a second alternative embodiment of a typical deskewing circuit of FIG. 1.
Figure 12:
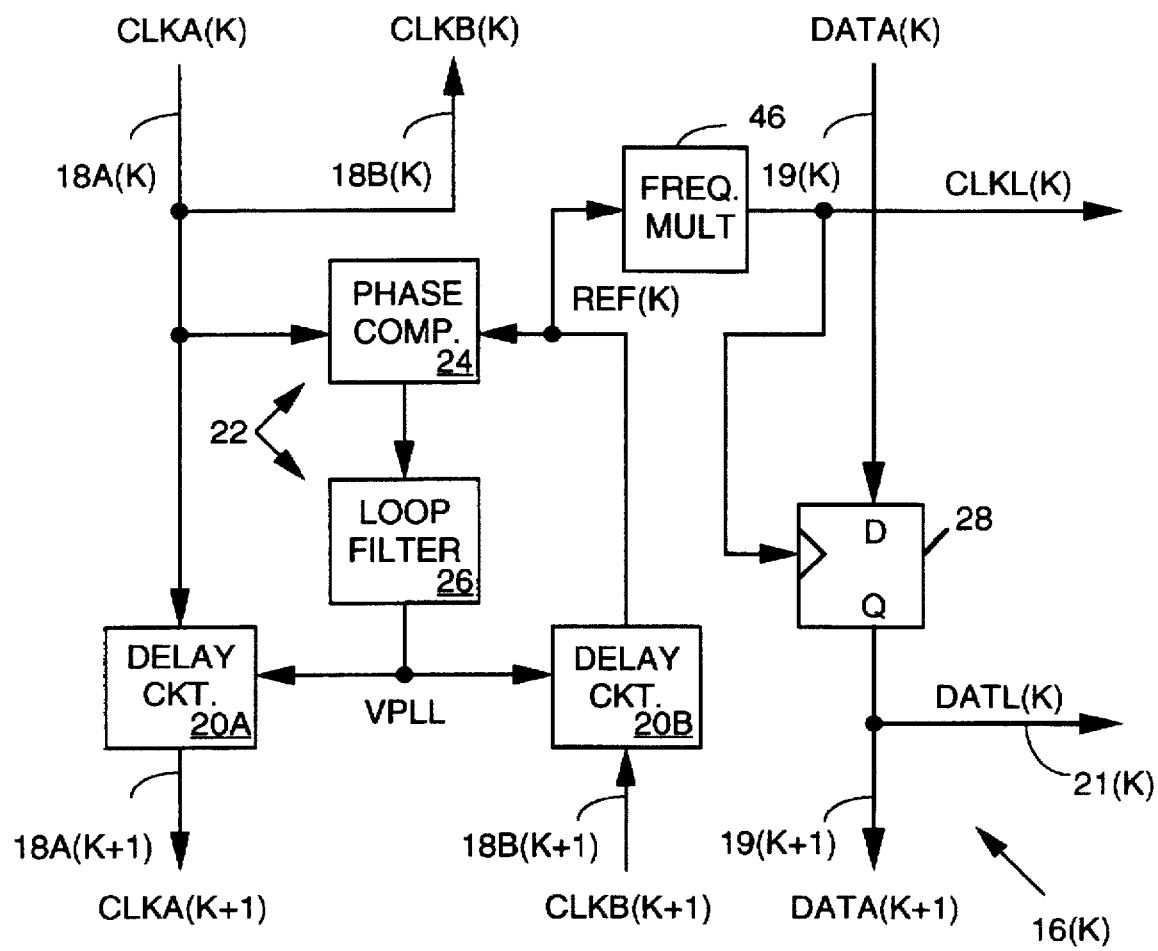
FIG. 12 is a block diagram depicting a fourth alternative embodiment of a typical deskewing circuit of FIG. 1.

As discussed herein above, the range of delay circuits 20A and 20B and the range of variation in transmission line distance between modules range should be limited so that the total delay between clock inputs to successive stages 16(K) and 16(K+1) settles at the period T of the CLKA signal (and not T/2) at phase lock. To avoid such restrictions in an alternative embodiment of the invention, a frequency multiplier 46 is added to each stage 16(K) as illustrated in FIG. 4. Frequency multiplier 46 doubles the frequency of incoming clock signal CLKA(K) to produce local clock signal CLKL(L). This ensures that even though some stage input signals CLKA(2)–CLKA(K) may be in phase with the first stage input signal CLKA(1) of FIG. 1 while other stage input signals may be 180 degrees out of phase with CLKA (1), all local clock signals CLKL(1)–CLKL(N) will be in phase with one another. It should be mentioned that when using stages of the type illustrated in FIG. 4, a frequency multiplier similar to multiplier 46 should be inserted in the CLKA(1) signal path between clock source 14 and host 11 (FIG. 1) if it is necessary that the clock signal supplied to the host has same the frequency as the local clock signals CLKL(1)–CLKL(N). It should also be noted that since REF(K) is phase locked to CLKA(K), the REF(K) signal could be supplied to the input of frequency multiplier 46 instead of CLKA(K) as illustrated in FIG. 12 without affecting system performance.

Figure 5:
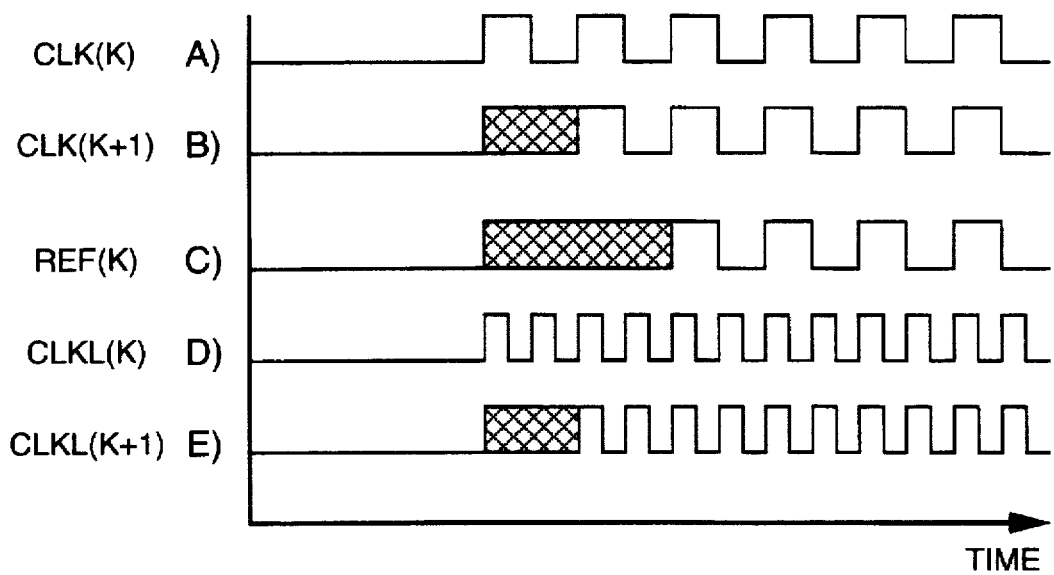
FIGS. 5 and 6 are timing diagrams illustrating operation of the deskewing circuit of FIG. 4.
Figure 6:
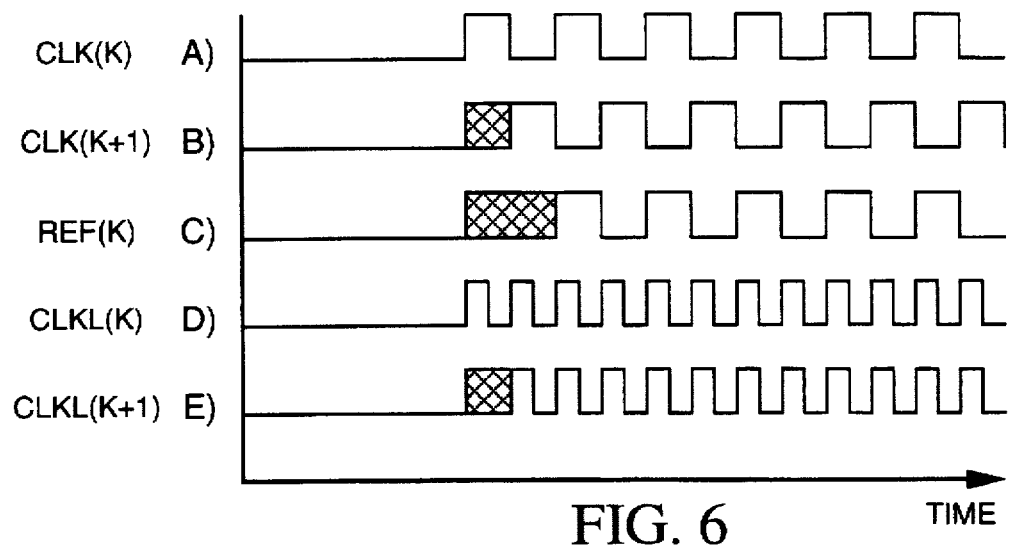

FIGS. 5 and 6 are timing diagrams illustrating operation of the circuit of FIG. 1 when stages similar to that shown in FIG. 4 are employed. For simplicity, the timing diagrams do not show transient response prior to phase lock. FIG. 5 illustrates a case where a CLKA(K) pulse input to stage 16(K) requires two full cycles to make the round trip from one input of phase comparator 24, through delay circuit 20A to stage 16(K+1) and then back to through delay circuit 20B of stage 16(K) to the other input of comparator 24. Thus REF(K) lags CLKA(K) by two cycles and CLKA(K+1) is phase locked to CLKA(K). Local clock signals CLKL(K) and CLKL(K+1), frequency multiplied versions of CLKA (K), are in phase with one another.

FIG. 6 illustrates a case where a CLKA(K) pulse input to stage 16(K) requires only one cycle to make the round trip from one input phase comparator 24 to the other. Since REF(K) lags CLKA(K) by only one cycle, CLKA(K+1) is 180 degrees out of phase with CLKA(K). Nonetheless, the frequency multiplied local clock signals CLKL(K) and CLKL(K+1) are in phase with one another. Those skilled in the art will recognize that frequency multipliers 24 of each stage could multiply the CLKA(K) frequency by any even integer {2, 4, 6 . . . } to produce local clock signals that are in phase with one another.

Figure 7:
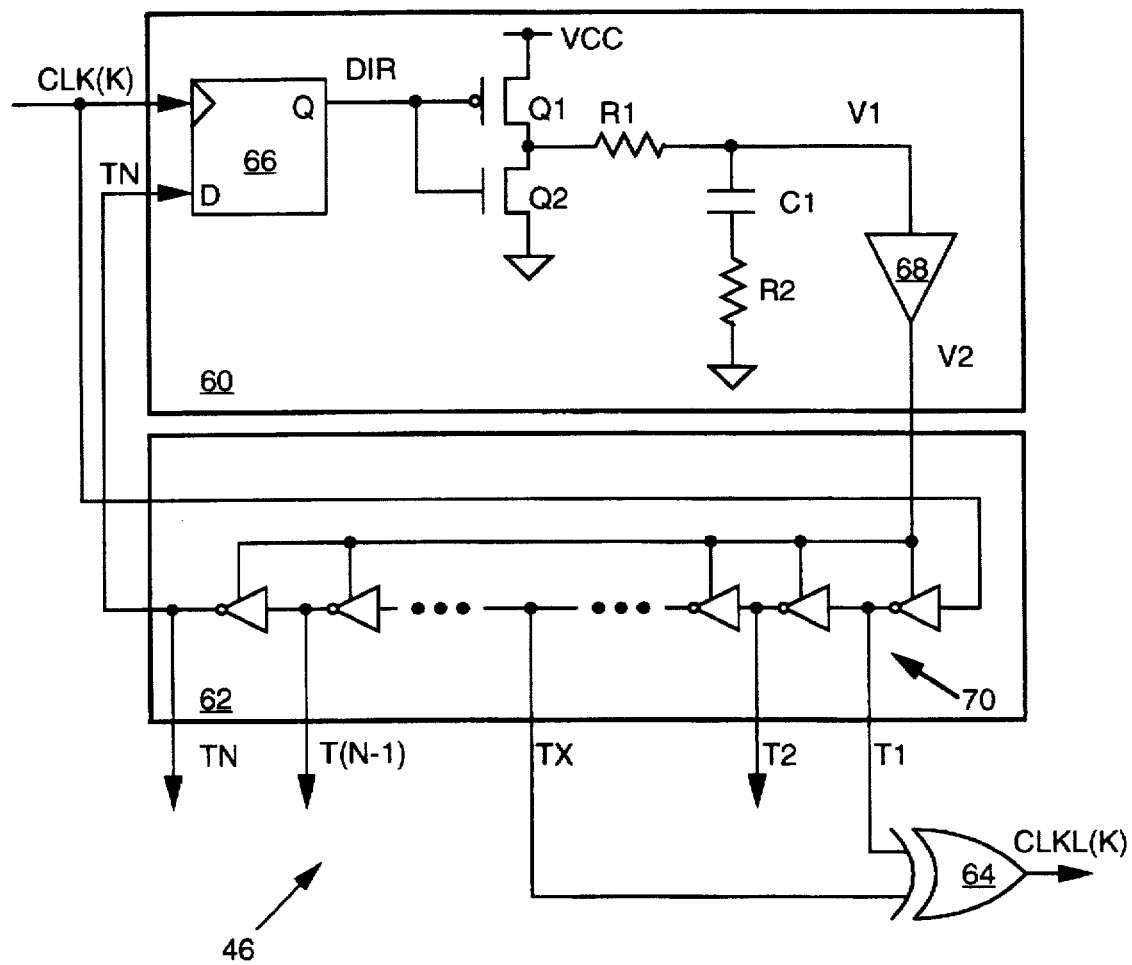
FIG. 7 is a block diagram depicting the frequency multiplier of FIG. 4.

FIG. 7 illustrates a novel circuit for frequency multiplier 46 of FIG. 4 in more detail. (Other types of frequency multipliers well known in the art could be employed.) The CLKA(K) signal is applied as input to a phase lock loop (PLL) controller 60. PLL controller 60 produces an output voltage signal V2 that controls the delay of each stage of a multiple stage delay line 62. Delay line 62 produces a set of output tap signals T1–TN having similar frequency but evenly distributed in phase. The CLK(K) signal drives the input of delay line 62. The last delay line output, tap TN, is applied to a second input of PLL controller 60. PLL controller 60 adjusts its output voltage V2 so that TN is phase and frequency locked to CLKA(K). Tap signals T1–TN are therefore all frequency locked to CLKA(K) but are evenly distributed in phase. Tap signal T1 and a tap signal TX (where TX is a particular one of tap signals T2–TN that is ¼ cycle out of phase with T1) are supplied as inputs to an XOR gate 64. The output signal produced by XOR gate 64 is twice the frequency of CLKA(K).

PLL controller 60 includes a type D flip-flop (FF) 66 receiving the CLKA(K) signal at its clock input and the T1 signal at its D input. FF 66 pulls up a signal DIR at its Q output when T1 lags CLKA(K) and pulls down the DIR signal PD at its Q output when T1 leads CLKA(K). The DIR signal drives the gates of a pmos transistor Q1 and an nmos transistor Q2 connected in series between power supply VCC and ground. When DIR is high Q2 discharges a capacitor C1 through resistors R1 and R2 and when DIR is low Q1 charges capacitor C1 through resistors R1 and R1. The voltage V1 across capacitor C1 and R2 drives a unity gain amplifier 68 producing the PLL controller output signal V2.

Delay line 62 is formed by a set of inverters 70 connected in series. The T1–TN tap signals appear at outputs of inverters 70. The V2 signal supplies power to inverters 70, controlling their switching speed so as to bring TN into phase with CLKA(K). With inverters 70 all having identical switching speeds, tap signals T1–TN are evenly distributed in phase relative to the CLKA(K) signal. PLL controller 22 of FIG. 4 may be similar in design to PLL controller 60 of FIG. 7.

Figure 8:
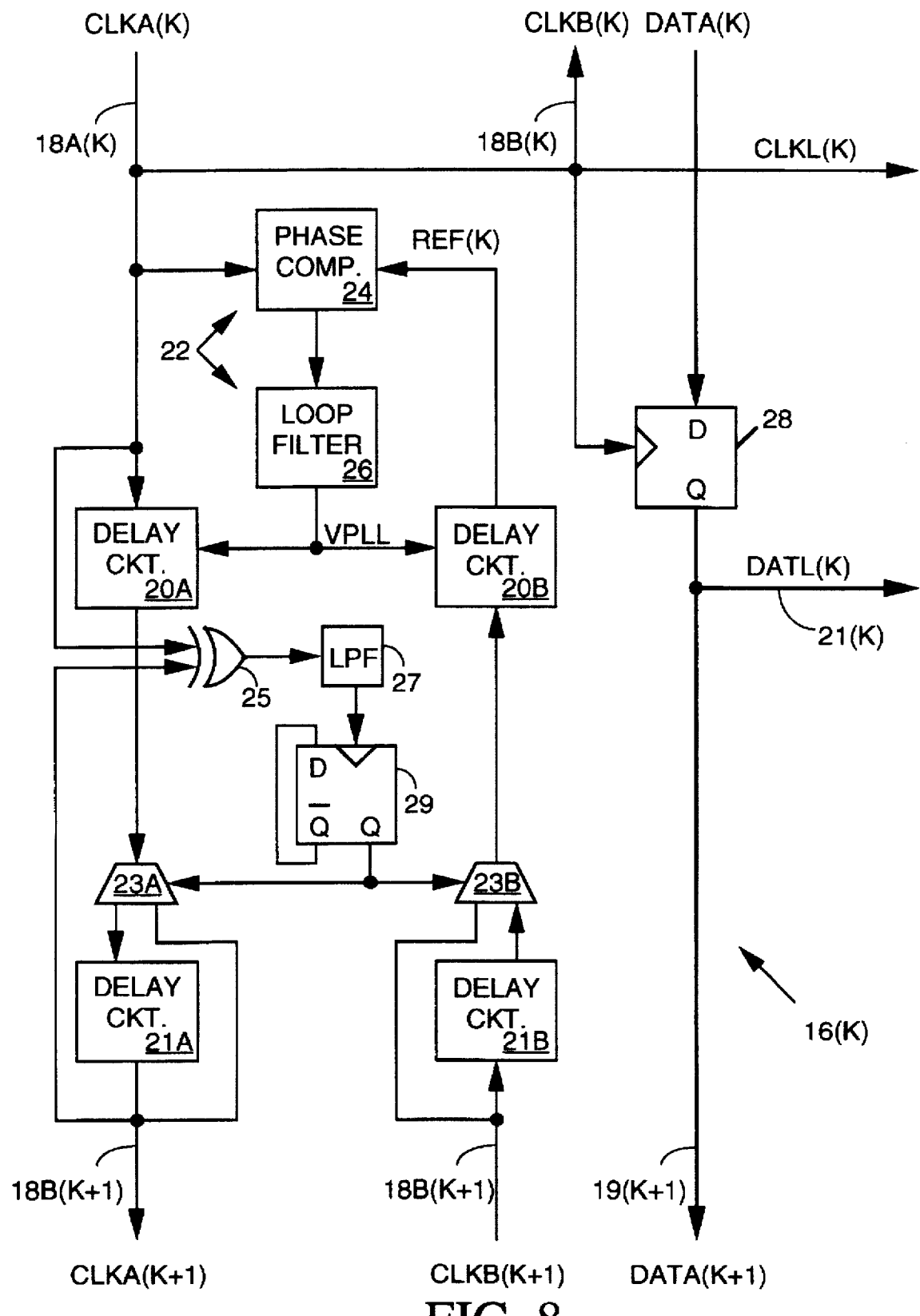
FIG. 8 is a block diagram depicting a third alternative embodiment of a typical deskewing circuit of FIG. 1.

FIG. 8 is a block diagram illustrating a third alternative embodiment of a typical deskewing circuit 16(K) of FIG. 1. This deskewing circuit eliminates false locking when the delay of transmission lines 18A(K)/18B(K) is very small compared to the period of the CLKA(K) clock signals. In such case the deskewing circuit should provide delay that is nearly one full clock signal period. The deskewing circuit of FIG. 8 monitors the phase relationship between its input and output CLKA(K)/CLKA(K+1) clock signals. If the deskewing circuit detects that its input and output clock signals CLKA(K)/CLKA(K+1) are nearly 180 degrees out of phase, it knows that false lock has occurred. In such event it adds or removes a delay from the signal path that is approximately equal to one half the period of the clock signals.

The deskewing circuit of FIG. 8 is generally similar to the deskewing circuit of FIG. 2 and similar components have been designated by similar reference characters. However the deskewing circuit of FIG. 8 adds delay circuits 21A and 21B, multiplexers 23A and 23B, an XOR gate 25, a low pass filter 27 and a toggling flip-flop 29 to the circuit of FIG. 8. Delay circuits 21A and 21B provide fixed delays approximately ½ the period of clock signal CLKA(K). Multiplexer 23A selectively places delay circuit 21A in the path of output CLKA(K+1) of delay circuit 20A. Multiplexer 23B switches delay circuit 21B in and out of the path of the CLKB(K+1) input to delay circuit 20B. XOR gate 25 receives CLKA(K) and CLKA(K+1) and supplies its output signal to low pass filter 27. If the two clock signals CLKA(K) and CLKA(K+1) are substantially out of phase, the XOR gate 25 output is frequently high and the output of low pass filter 27 increases. When the output of filter 27 reaches a threshold, the output of toggling flip-flop 29 changes state, thereby switching multiplexers 23A and 23B. If delay circuits 21A and 21B were in the CLKA(K+1) and CLKB(K+1) signal paths, multiplexers 23A and 23B now remove them. Conversely, if delay circuits 21A and 21B were not in the CLKA(K+1) and CLKB(K+1) signal paths, multiplexers 23A and 23B put them back in the signal paths. In either case the system will immediately switch from the false lock state where CLKA (K+1) is 180 degrees out of phase with CLKA(K) to a full lock state where CLKA(K+1) is in phase with CLKA(K).

It should be understood by those skilled in the art that the inputs to XOR gate 25 may alternatively be supplied by CLKB(K+1) and REF(K). Also, instead of switching delay circuits 201A and 21B in or out of the CLKA(K) and CLK(B(K+1) signal paths, the output of flip-flop 29 could be used selectively level shift VPLL by an appropriate amount so that the delay provided by delay circuits 20A and 20B abruptly changes by approximately one half a clock cycle T/2. This could be accomplished, for example, by using the flip-flop 29 Q output to control a multiplexer switching a level shifting circuit in and out of the VPLL signal path between filter 26 and delay circuits 20A and 20B.

Figure 9:
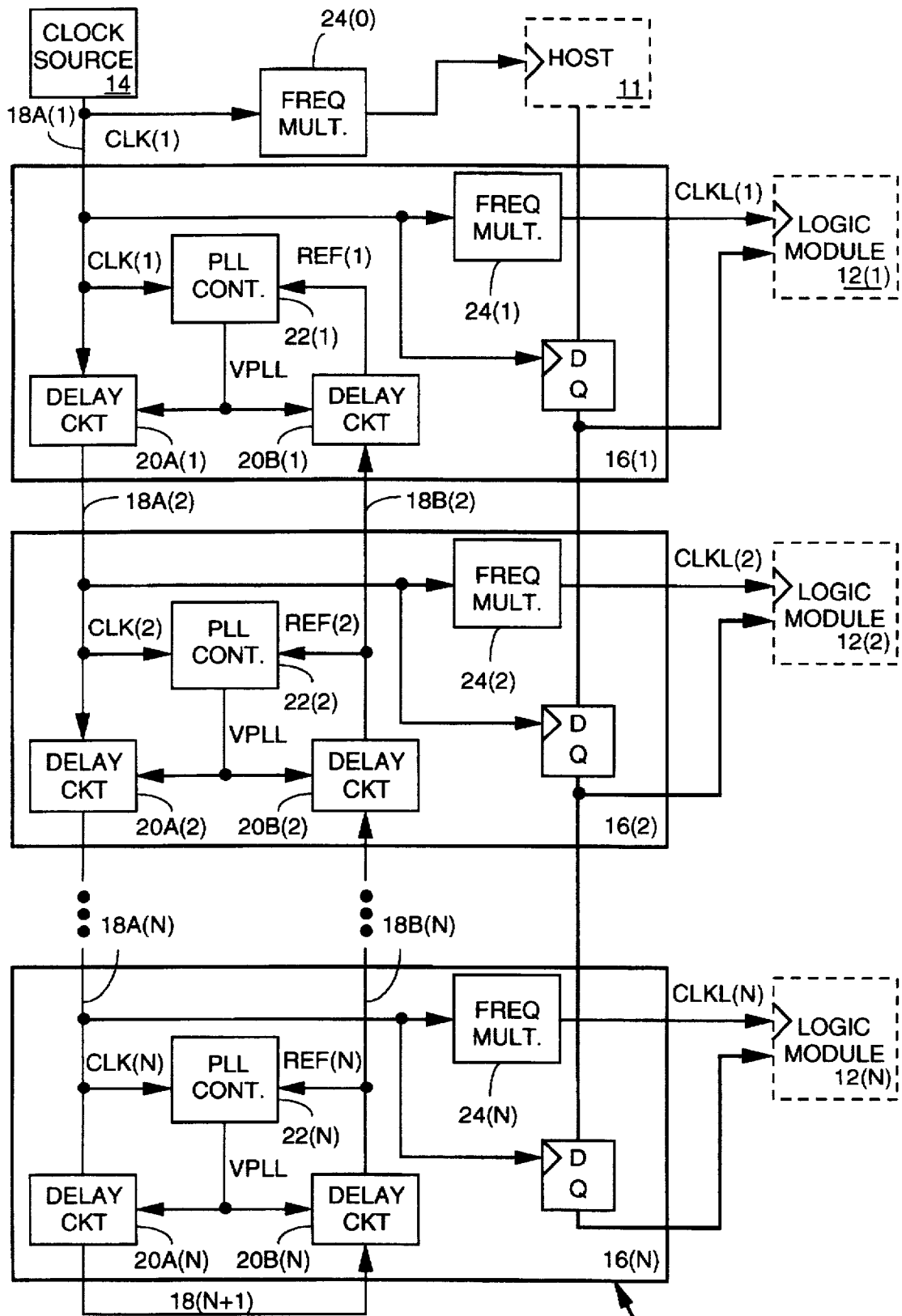
FIGS. 9 and 10 are block diagrams depicting alternative embodiments of the clock signal distribution system in accordance with the present invention.

FIG. 9 illustrates an alternative embodiment of the invention in which the delay circuits 20A(K) and 20B(K) of all stages are interconnected to form a long delay line. A CLKA(1) pulse entering stage 16(1) from source 14 passes through delay circuits 20A(1)–20A(N) of all stages 16(1)–16(N) in succession. At stage 16(N) the pulse is then routed via a transmission line 18A(N+1) from the output of delay circuit 20A(N) and back to the input of delay circuit 20B(N) of stage 16(N). The pulse then travels back through delay circuits 20B(N)–20(1) of all stages in reverse order. The PLL controller 22 of each stage 16(K) phase locks its own reference signal REF(K) to its input clock signal CLKA(K).

Figure 10:
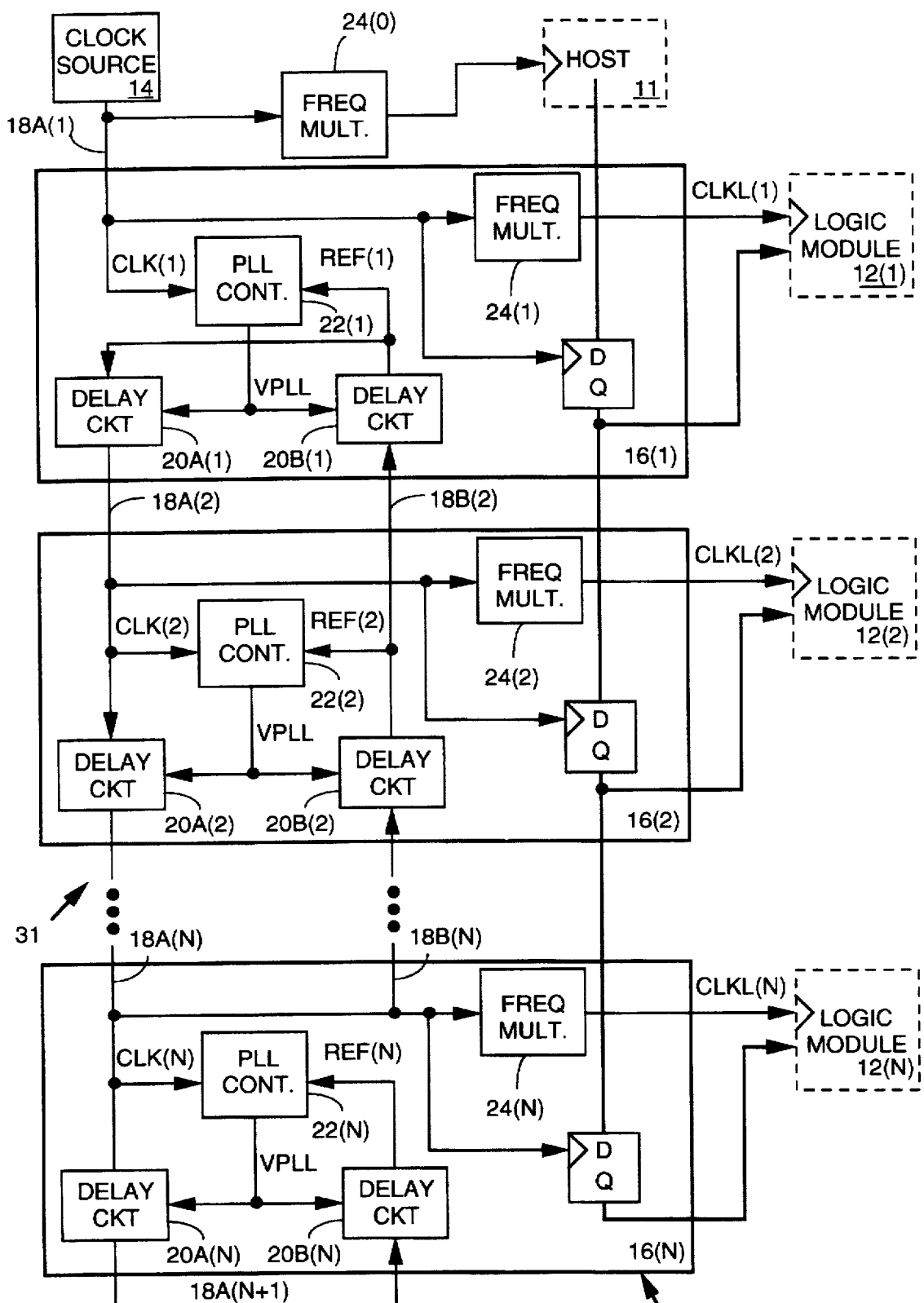

FIG. 10 illustrates another alternative embodiment of the invention using stages similar to that shown in FIG. 4 but in which the delay circuits 20A(1)–20(N) and 20B(1)–20B(N) of all stages are interconnected in a loop to form a voltage controlled oscillator (VCO) 31. Clock signal pulses pass in succession through delay circuits 20A(1)–20A(N), then pass in reverse succession through delay circuits 20B(N)–20B(1). Within stage 16(1) the REF(1) output of delay circuit 20B is fed back into the input of delay circuit 20A(1). PLL controller 22 of stage 16(1) adjusts delay circuits 20A(1) and 20B(1) of stage 16(1) to phase lock REF(1) to CLKA(1), thereby setting the overall frequency of the VCO 31 formed by delay circuits 20A(1)–20A(9) and 20B(1)–20B(N). The PLL controllers 22 of stages 16(2)–16(N) adjust their delay circuits 20A and 20B to compensate for variations is signals paths between the stages, thereby to ensure that each stage provides a one clock cycle delay.

Figure 11:
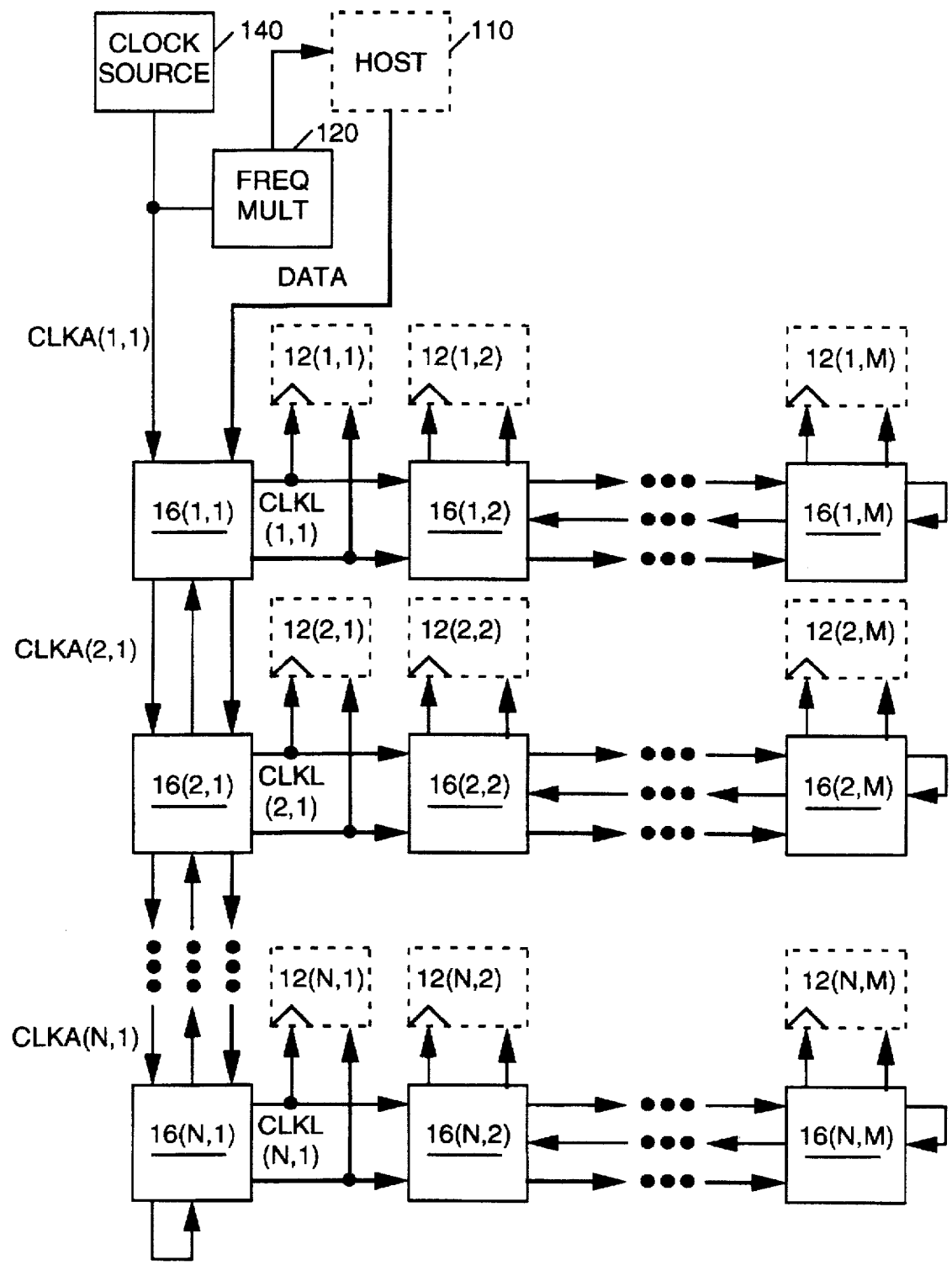
FIG. 11 is a block diagram depicting a multi-dimensional clock signal distribution system in accordance with the present invention.

FIG. 11 illustrates a "two dimensional" deskewing system 50 in accordance with the present invention for providing synchronized clock and data signals to a large N×M array of local circuit modules 12(1,1)–12(N,M) (destination sites). Deskewing system 50 includes an N×M array of deskewing stages 16(1,1) to 16(N,M) similar to the deskewing circuits of FIG. 4. The first column of deskewing stages 16(1,1)–16(N,1) operate in a manner to "one-dimensional" deskewing systems of FIGS. 9 or 10 and produce a set of N output local clock signals CLKL(1,1)–CLKL(N,1) for clocking a first column of corresponding local modules 12(1,1)–12(N,1). However the local clock signal CLKL(K,1) of the Kth stage 16(K,1) is also used as reference clock input to a corresponding Kth row of deskewing circuits 16(K,2)–16(K,M). The Kth row of deskewing circuits are also interconnected in a manner similar to deskewing circuits of FIGS. 9 or 10 and produce an additional set of local clock signals CLKL(K,2)–CLKL(K,M) supplied to a corresponding row of logic modules 12(K,2)–12(K,M). All local clock signals 12(1,1)–12(N,M) will be in phase with one another. Data or control signals from host module 11 are also routed through the stages of the first column in succession. The first stage of each row also supplies its output local data signal as the data input to the remaining stages of the row.

In servicing large arrays of local modules 12, the two dimensional distribution system 5- of FIG. 11 has an advantage over the one dimensional systems of FIG. 1, 9 or 10 in that clock signal routing paths are shorter. For example in the one dimensional system of FIGS. 1, 9 or 10 having 400 local modules, the clock signal output of source 14 must pass though 400 stages to reach the most remote local module. In a 20×20 two dimensional system of the type illustrated in FIG. 11, the clock signal passes through only 39 stages to reach the most remote logic module. The shorter path reduces clock signal jitter. It should be apparent to those skilled in the art that the array of FIG. 11 can be expanded to more than two dimensions by using the local output clock signals of all stages 16(1,1)–16(N,M) as reference clock inputs to additional groups of stages. Thus the clock signal distribution system of the present invention can be expanded to provide synchronized local clocks to very large multidimensional arrays of local circuit modules.

Although FIG. 11 shows a regular array of deskewing circuits, it should be understood that the circuits need not necessarily be spatially arrayed. That is, it is not necessary that the deskewing circuits or local modules be physically arranged in rows and columns as shown. It is necessary only that data and clock signal lines be routed to the modules in the order illustrated and that the transmission lines interconnecting adjacent pairs of deskewing circuits have matching delays.

Those skilled in the art will appreciate that similar multidimensional signal distribution systems may also be constructed as an extension of the system of FIG. 1 using N×M arrays of deskewing circuits of the type illustrated in FIGS. 2 or 8.

While the forgoing specification has described preferred embodiment(s) of the present invention, one skilled in the art may make many modifications to the preferred embodiment without departing form the invention in its broader aspects. The appended claims therefore are intended to cover all such modifications as fall within the true scope and spirit of the invention.

What is claimed is:

1. An apparatus for distributing signals comprising:
   a sequence of stages, each stage comprising first delay means for receiving and delaying a periodic first input signal by a first adjustable delay time to produce a periodic first output signal, second delay means for receiving and delaying a periodic second input signal by a second adjustable delay time to produce a periodic second output signal, control means for receiving said first input signal and said second output signal and generating a delay control signal supplied to said first and second delay means for adjusting said first and second adjustable delay times so as to phase lock said second output signal to said first input signal, and means for producing a periodic third output signal having a phase and frequency tracking a phase and frequency of said first input signal;
   means for supplying a periodic reference clock signal as the first input signal to a first stage of said sequence;
   first signal conductor means for conveying the first output signal of each stage other than a last stage of said sequence as the first input signal to a next succeeding stage of said sequence; and
   second signal conductor means for conveying the third output signal of each stage other than the first stage as the second input signal to a next preceding stage of said sequence.

2. The apparatus in accordance with claim 1 wherein each stage further comprises a frequency multiplier for frequency multiplying said first input signal thereby to produce an output local clock signal.

3. The apparatus in accordance with claim 1 wherein each stage further comprises a frequency multiplier for frequency multiplying said second output signal thereby to produce an output local clock signal.

4. The apparatus in accordance with claim 1 wherein each stage adjusts said first and second adjustable delay times so as to phase lock said second output signal to said first input signal.

5. The apparatus in accordance with claim 1 wherein each stage adjusts said first and second adjustable delay times to be substantially equal and so as to phase lock said second input signal to said first input signal.

6. The apparatus in accordance with claim 1 wherein said first and second signal conductor means convey said first and third output signals between adjacent stages of said sequence with substantially similar signal propagation delays.

7. The apparatus in accordance with claim 2 wherein said frequency multiplier comprises:
- a delay circuit for receiving and successively delaying said first input signal to produce a plurality of periodic tap signals of similar frequency but which differ in phase one from another by a phase increment set by a magnitude of an input control signal;
- phase lock means receiving said first input signal and one of said tap signals and providing said input control signal to said delay circuit, said control means adjusting the magnitude of said input control signal such that one of said tap signals is phase locked to said first input signal; and
- logic means for receiving and logically combining at least two of said tap signals thereby to produce said output local clock signal.

8. The apparatus in accordance with claim 7 wherein said logic means exclusively OR's said at least two of said tap signals.

9. The apparatus in accordance with claim 1 wherein each of said stages further comprises an input terminal, an output terminal, and latching means for latching a data signal appearing at said input terminal onto an output node during each cycle of said periodic first input signal, and
wherein said apparatus further comprises third signal conductor means for connecting the output terminal of each stage other than the last stage of said sequence to the input terminal of a next succeeding stage of said sequence.

10. The apparatus in accordance with claim 1 wherein said means for producing a periodic third output signal having a phase and frequency tracking a phase and frequency of said first input signal comprises means for receiving said first input signal and producing said third output signal in response thereto.

11. The apparatus in accordance with claim 1 wherein said means for producing a periodic third output signal having a phase and frequency tracking a phase and frequency of said first input signal comprises an amplifier for receiving and amplifying said first input signal to produce said third output signal.

12. The apparatus in accordance with claim 1 wherein said means for producing a periodic third output signal having a phase and frequency tracking a phase and frequency of said first input signal comprises means for receiving said second output signal and producing said third output signal in response thereto.

13. The apparatus in accordance with claim 1 wherein each of said control means comprises:
- means for receiving said first input signal and said second output signal and producing an indicating signal of state indicating a phase relationship therebetween, and
- means for integrating said indicating signal to produce said control signal.

14. The apparatus in accordance with claim 1 wherein said first delay means comprises a first series of logic gates, a first logic gate of said first series receiving said first input signal, said first input signal propagating through said first series and emerging from a last logic gate of said first series as said first output signal, said control signal being applied to each logic gate of said first series for controlling its switching speed, and
wherein said second delay means comprises a second series of logic gates, a first logic gate of said second series receiving said second input signal, said second input signal propagating through said second series and emerging from a last logic gate of said second series as said second output signal, said control signal being applied to each logic gate of said second series for controlling its switching speed.

15. The apparatus in accordance with claim 14 wherein each stage further comprises means for receiving said first input signal and said first output signal and for adjusting a number of logic gates in said series in accordance with a phase relationship between said first input signal and said first output signal.

16. The apparatus in accordance with claim 14 wherein each stage further comprises means for receiving said second input signal and said second output signal and for adjusting a number of logic gates in said series in accordance with a phase relationship between said second input signal and said second output signal.

17. An apparatus for distributing signals comprising:
- an array of N rows of stages with M stages in each sequence, wherein M and N are integers greater than 1, each stage comprising first delay means for receiving and delaying a periodic first input signal by a first adjustable delay time to produce a periodic first output signal, second delay means for receiving and delaying a periodic second input signal by a second adjustable delay time to produce a periodic second output signal, control means for receiving said first input signal and said second output signal and generating a delay control signal supplied to said first and second delay means for adjusting said first and second adjustable delay times so as to phase lock said second output signal to said first input signal, means for producing a periodic third output signal having a phase and frequency tracking a phase and frequency of said first input signal, and means for generating a periodic local clock signal in response to one of said first input and second output signals;
- means for supplying a periodic reference clock signal as the first input signal to a first stage of the first row of sequence;
- first signal conductor means for conveying the first output signal of the first stage of each row other than the first stage of the last row of said array as the first input signal to the first stage of a next succeeding row of said array;
- second signal conductor means for conveying the third output signal of the first stage of each row of said array other than the first stage of said first row as the second input signal to the first stage of a next preceding row of said array;
- third signal conductor means for conveying the local clock signal produced by the first stage of each row of the array as the first input signal to a second stage of the same row of the array;
- fourth signal conductor means for conveying the second output signal produced by each stage other than the first stage of each row of the array as the first input signal to a next succeeding stage of the same row; and
- fifth signal conductor means for conveying the third output signal of each stage other than the first and second stages of each row as the second input signal to the next preceding stage of the same row.

18. The apparatus in accordance with claim 17 wherein said means for generating a periodic local clock signal in response to one of said first input and second output signals comprises a frequency multiplier for frequency multiplying one of said first input and second output signals thereby to produce said local clock signal.

19. The apparatus in accordance with claim 17 wherein each stage adjusts said first and second adjustable delay times so as to phase lock said second output signal to said first input signal.

20. The apparatus in accordance with claim 17 wherein each stage adjusts said first and second adjustable delay times to be substantially equal and so as to phase lock said second input signal to said first input signal.

21. The apparatus in accordance with claim 17 wherein said first and second signal conductor means convey said first and third output signals between first stages of adjacent rows with substantially similar signal propagation delays.

22. The apparatus in accordance with claim 17 wherein each of said stages further comprises an input terminal, an output terminal, and latching means for latching a data signal appearing at said input terminal onto output node during each cycle of said periodic first input signal, and wherein said apparatus further comprises:

sixth signal conductor means for connecting the output terminal of each stage of each row other than the last row the input terminal of the first stage of a next succeeding row, and seventh signal conductor means for connecting the output terminal of each stage other than the last stage of each row to the input terminal of a next stage of the same row.

23. The apparatus in accordance with claim 17 wherein said means for producing a periodic third output signal having a phase and frequency tracking a phase and frequency of said first input signal comprises means for receiving one of said first input and second output signals and producing said third output signal in response thereto.

24. The apparatus in accordance with claim 17 wherein said control means comprises:

means for receiving said first input signal and said second output signal and producing an indicating signal of state indicating a phase relationship therebetween, and means for integrating said indicating signal to produce said control signal.

25. The apparatus in accordance with claim 17 wherein said first delay means comprises a first series of logic gates, a first logic gate of said first series receiving said first input signal, said first input signal propagating through said first series and emerging from a last logic gate of said first series as said first output signal, said control signal being applied to each logic gate of said first series for controlling its switching speed, and wherein said second delay means comprises a second series of logic gates, a first logic gate of said second series receiving said second input signal, said second input signal propagating through said second series and emerging from a last logic gate of said second series as said second output signal, said control signal being applied to each logic gate of said second series for controlling its switching speed.

26. The apparatus in accordance with claim 25 wherein each stage further comprises means for receiving said first input signal and said first output signal and for adjusting a number of logic gates in said series in accordance with a phase relationship between said first input signal and said first output signal.

27. The apparatus in accordance with claim 25 wherein each stage further comprises means for receiving said second input signal and said second output signal and for adjusting a number of logic gates in said series in accordance with a phase relationship between said second input signal and said second output signal.

* * * * *